United States Patent [19]
Yi et al.

[11] Patent Number: 6,101,119
[45] Date of Patent: Aug. 8, 2000

[54] APPARATUS FOR DRIVING CELL PLATE LINE OF MEMORY DEVICE USING TWO POWER SUPPLY VOLTAGE SOURCES

[75] Inventors: Seung-Hyun Yi; Jae-Whan Kim, both of Ichon-shi, Rep. of Korea

[73] Assignee: Hyundai Electronics Industries Co., Ltd., Icho-shi, Rep. of Korea

[21] Appl. No.: 09/428,547

[22] Filed: Oct. 28, 1999

[30] Foreign Application Priority Data

Oct. 28, 1998 [KR] Rep. of Korea ............... 98-45299

[51] Int. Cl.[7] ................................... G11C 11/24
[52] U.S. Cl. ................. 365/149; 365/226; 365/145
[58] Field of Search .................... 365/149, 145, 365/226

[56] References Cited

U.S. PATENT DOCUMENTS

| | | | |
|---|---|---|---|
| 5,600,587 | 2/1997 | Koike | 365/145 |
| 5,608,667 | 3/1997 | Osawa | 365/145 |
| 5,671,174 | 9/1997 | Koike et al. | 365/145 |
| 6,034,884 | 3/2000 | Jung | 365/145 |
| 6,038,162 | 3/2000 | Takata et al. | 365/145 |

*Primary Examiner*—Richard Elms
*Assistant Examiner*—Tuan T. Nguyen
*Attorney, Agent, or Firm*—Jacobson, Price, Holman & Stern, PLLC

[57] ABSTRACT

An apparatus for driving a cell plate line of a semiconductor memory device having a plurality of memory cells, includes: a first driving means for driving the cell plate line with a first power supply voltage; a second driving means for driving the cell plate line with a second power supply voltage higher than the first power supply voltage; and a driving control means for enabling said second driving means for a predetermined time in order to activate the cell plate line in response to a control signal from an external circuit and enabling said first driving means after the predetermined time in order to stabilize said second driving means enables, wherein the control signal is employed to select one memory cell related to the cell plate line. Thereby, the apparatus can the high-speed operation of a ferroelectric random access memory (FeRAM) by using two power supply voltage sources.

7 Claims, 4 Drawing Sheets

APPARATUS FOR DRIVING CELL PLATE LINE OF MEMORY DEVICE USING TWO POWER SUPPLY VOLTAGE SOURCES

FIELD OF THE INVENTION

The present invention relates to an apparatus for driving a cell plate line of a memory device; and, more particularly, to an apparatus for driving a cell plate line of a memory device using two power supply voltage sources.

DESCRIPTION OF THE PRIOR ART

Generally, a dynamic random access memory (DRAM) includes a plurality of cells, which have a MOS transistor and a capacitor, respectively. The plurality of cells is arranged in a matrix through a word line and a bit line. A gate of the MOS transistor is coupled to the word line. The voltage level of the word line determines a cell selection. An NMOS transistor is employed in the cell of the DRAM. When the NMOS transistor transfers a high voltage to the capacitor, the threshold voltage of the NMOS transistor may be lost. Thus, the word line should be driven by the higher power supply voltage VPP than a power supply voltage VCC. A word line driving circuit has been employed in order to provide the higher power supply voltage to the word line.

Referring to FIG. 1, there is shown a cell of a conventional ferroelectric random access memory (FeRAM). Similar to the cell of the DRAM, the cell of the conventional FeRAM has a MOS transistor and a capacitor, which has a ferroelectric material. The word line driving circuit related to the DRAM as described above can not be applied to a cell plate line driving circuit related to the FeRAM. The reason why the word line driving circuit related to the DRAM can not be applied to the cell plate line driving circuit related to the FeRAM is because the cell plate line needs a specific voltage level when a cell plate line P/L is coupled to a ferroelectric capacitor.

Referring to FIG. 4A, there is shown a waveform diagram illustrating an output voltage of a conventional cell plate line driving circuit using one power supply voltage source. As shown, a cell plate line PLATE_LINE needs a time of approximately 40 nsec to be pulled up to a voltage of 3.3V. Accordingly, there is a problem that the conventional cell plate line driving circuit may not perform a high-speed operation of a memory cell.

SUMMARY OF THE INVENTION

It is, therefore, an object of the present invention to provide an apparatus for driving a cell plate line of a memory device using two power supply voltage sources that is capable of implementing the high-speed operation of a ferroelectric random access memory (FeRAM).

It is, therefore, another object of the present invention to provide an apparatus for driving a cell plate line of a memory device using two power supply voltage sources that is capable of improving the characteristics of a ferroelectric random access memory (FeRAM).

In accordance with an aspect of the present invention, there is provided an apparatus for driving a cell plate line of a semiconductor memory device having a plurality of memory cells, comprising: a first driving means for driving the cell plate line with a first power supply voltage; a second driving means for driving the cell plate line with a second power supply voltage higher than the first power supply voltage; and a driving control means for enabling said second driving means for a predetermined time in order to activate the cell plate line in response to a control signal from an external circuit and enabling said first driving means after the predetermined time in order to stabilize said second driving means enabled, wherein the control signal is employed to select one memory cell related to the cell plate line.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Figure 1:
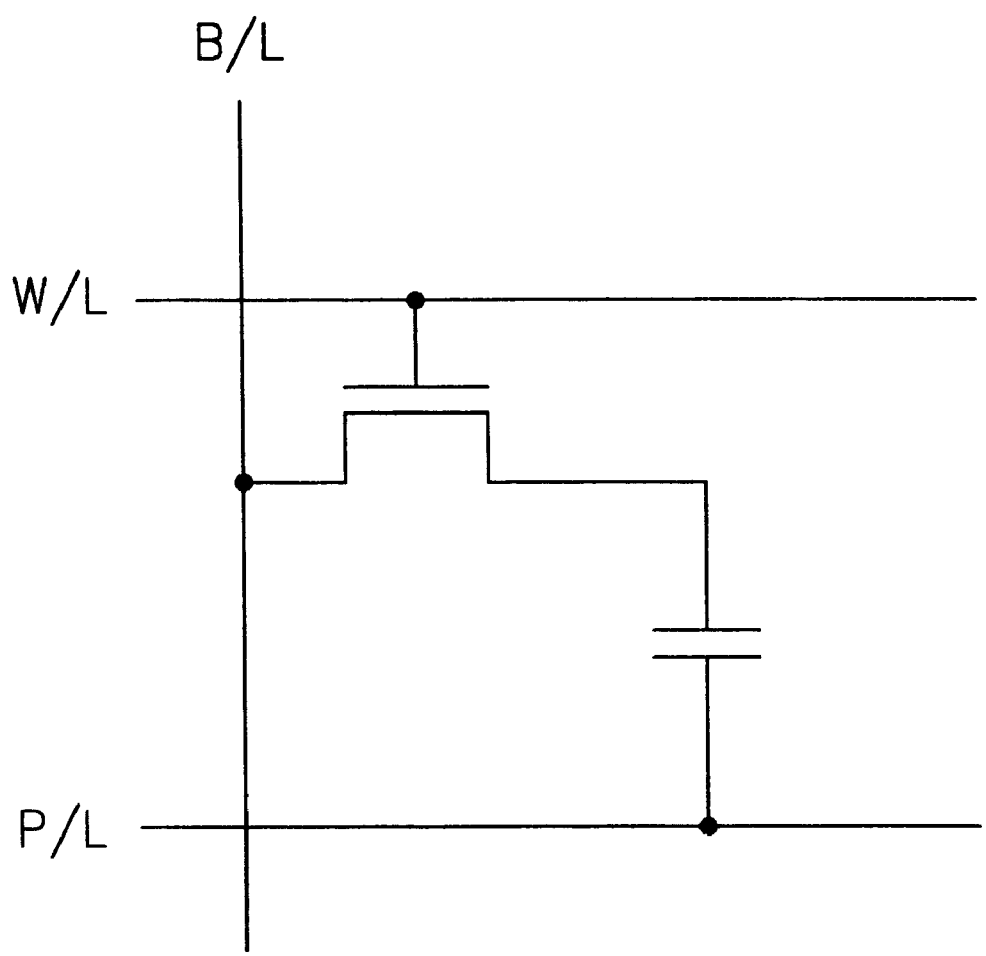
FIG. 1 is a circuit diagram showing a conventional cell of a ferroelectric random access memory device.
Figure 2:
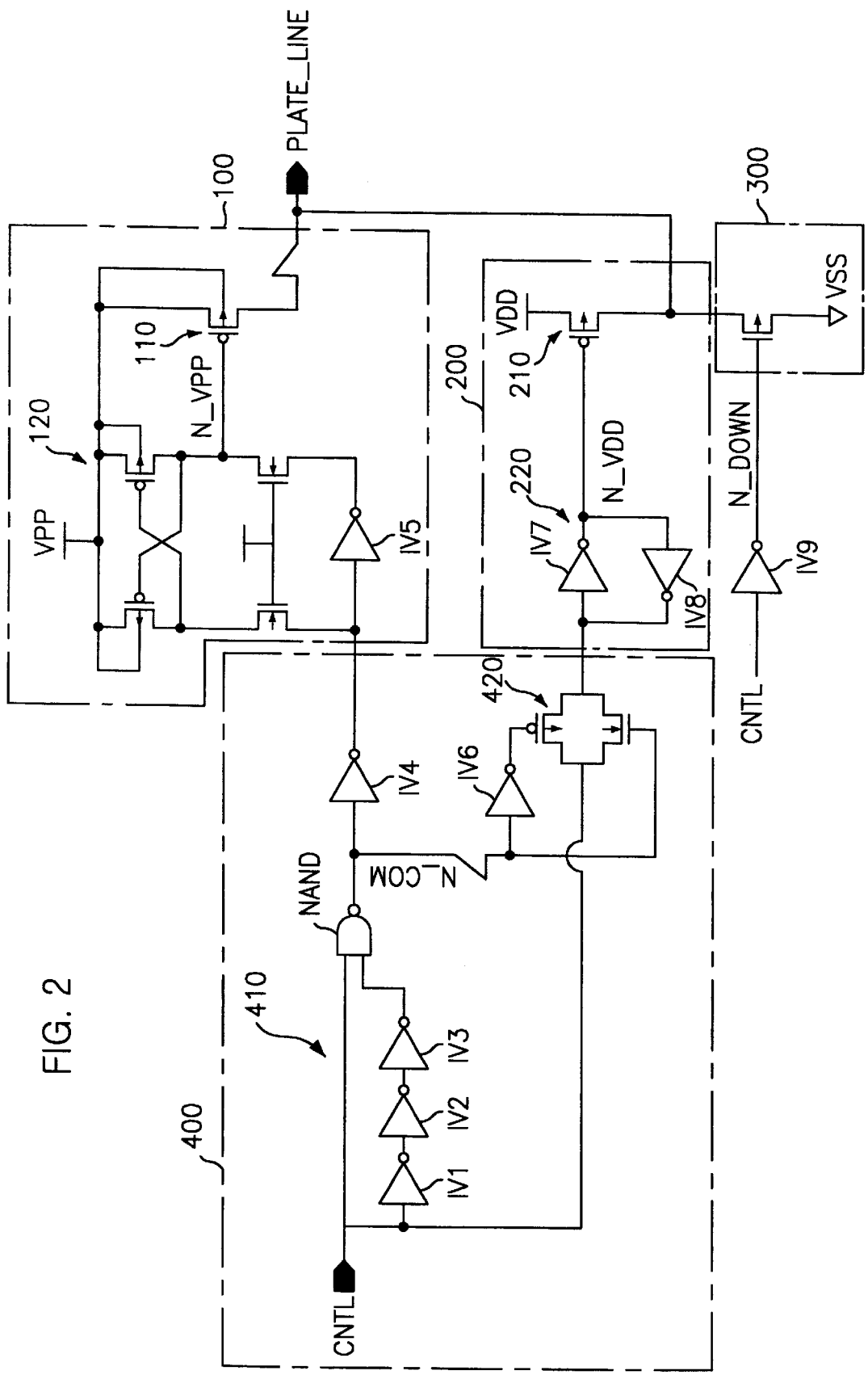
FIG. 2 is a circuit diagram showing a cell plate line driving circuit using two power supply voltage sources in accordance with the present invention.

Referring to FIG. 2, a driver 100 of a cell plate line driving circuit drives a cell plate line PLATE_LINE with a higher power supply voltage VPP than a power supply voltage VDD. A driver 200 drives the cell plate line PLATE_LINE with the power supply voltage VDD. A driver 300 drives the cell plate line PLATE_LINE with a ground voltage VSS. When a control signal CNTL from an external circuit is activated, a controller 400 enables the driver 100 for a predetermined time in response to the activated control signal CNTL, wherein the control signal CNTL is employed to select one memory cell related to the cell plate line PLATE-LINE in a semiconductor memory device having a plurality of memory cells. Then, the controller 400 enables the driver 200 after the predetermined time to stabilize the driver 100 enabled.

A PMOS transistor 110 of the driver 100 is coupled between a source of the higher power supply voltage VPP and the cell plate line PLATE_LINE. A circuit 120 of the driver 100 determines the voltage level of a gate of the PMOS transistor 110 so that the PMOS transistor 110 is turned on and off in response to an output signal of the controller 400.

A PMOS transistor 210 of the driver 200 is coupled between a source of the power supply voltage VDD and the cell plate line PLATE_LINE. A latch 220 of the driver 200 includes inverter IV7 and IV8 in order to latch an output signal of the controller 400.

A NMOS transistor as the driver 300 is coupled between a source of the ground voltage VSS and the cell plate line PLATE_LINE. A gate of the NMOS transistor receives the control signal CNTL inverted by an inverter IV 9.

A pulse generator 410 of the controller 400 generates a pulse having the pulse width of the predetermined time at a point of time when the control signal CNTL is activated, in order to enable the driver 100 for the predetermined time in response to the activated control signal CNTL. A CMOS pass gate 420 of the controller 400 passes the control signal CNTL in the response to the generated pulse from the pulse generator 410. The pulse generator 410 includes a series of inverters IV1, IV2 and IV3 and a NAND gate. The series of inverters IV1, IV2 and IV3 inverts and delays the control signal CNTL. The NAND gate performs the logical operation of NANDing the inverted and delayed control signal CNTL and the control signal CNTL.

Figure 3:
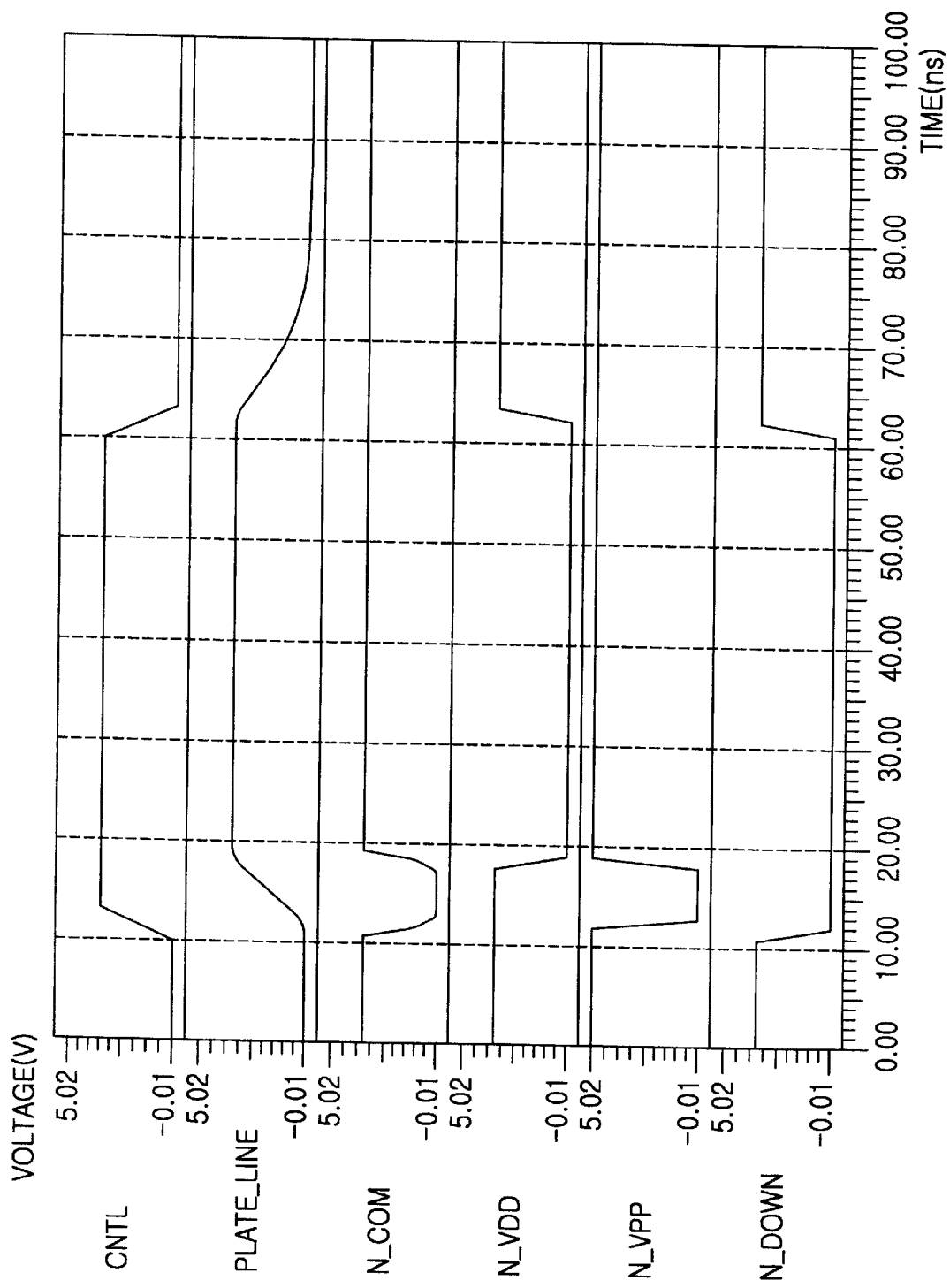
FIG. 3 is a timing diagram depicting signals of the cell plate line driving circuit shown in FIG. 2.

Referring to FIGS. 2 and 3, when the control signal CNTL is activated to a high signal, the NAND gate of the pulse generator 410 outputs a low signal as an output signal N_COM of the NAND gate after delaying by a delay time of the inverters IV1, IV2 and IV3.

As shown in FIG. 3, the output signal N_COM of the NAND gate of the pulse generator 410 has a low pulse signal at a point of time when the control signal CNTL is activated. While the output signal N_COM of the NAND gate of the pulse generator 410 is maintained at a low signal level, a gate voltage level N_VPP of a PMOS transistor 110 is maintained at the low signal level. Also, the higher power supply voltage VPP is applied to the cell plate line PLANT_LINE. When the output signal N_COM of the NAND gate is high after the predetermined time, the CMOS pass gate 420 is turned on to pass the control signal CNTL to a gate of the PMOS transistor 210. In other words, when the gate voltage level N_VDD of the PMOS transistor 210 is maintained at the low signal level, the power supply voltage VDD is applied to the cell plate line PLATE_LINE.

On the other hand, when the control signal CNTL is inactivated to the low signal, a gate voltage level N_DOWN of the NMOS transistor of the driver 300 is high. Then, the ground voltage VSS is applied to the cell plate line PLATE_LINE.

Figure 4A:
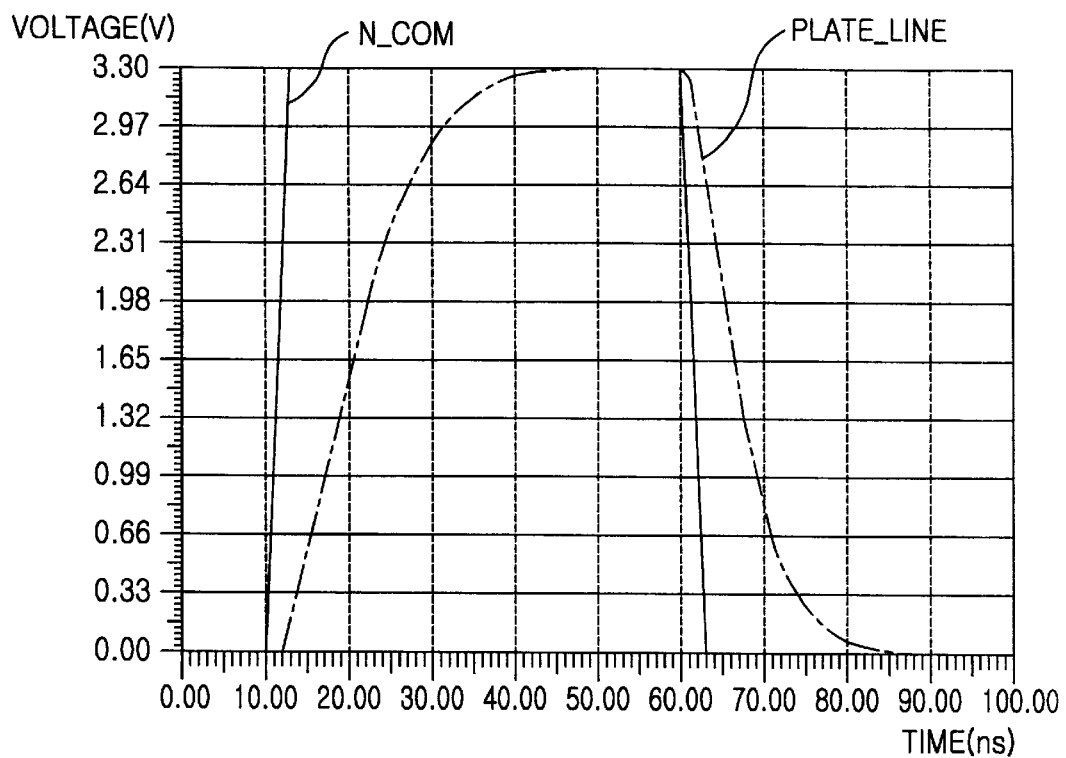
FIG. 4A is a waveform diagram illustrating an output voltage of a conventional cell plate line driving circuit using one power supply voltage source.
Figure 4B:
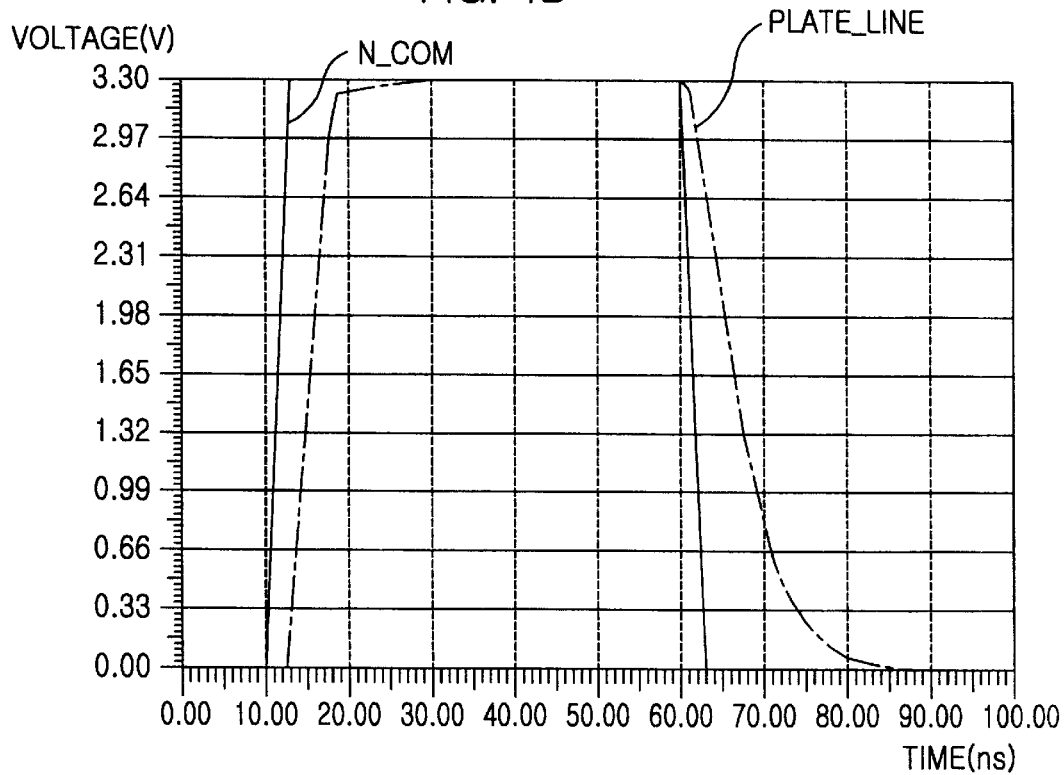
FIG. 4B is a waveform diagram illustrating an output voltage of the cell plate line driving circuit shown in FIG. 2.

Referring to FIG. 4B, there is shown a waveform diagram illustrating an output voltage of the cell plate line driving circuit shown in FIG. 2. As shown, the cell plate line PLATE_LINE needs a time of less than 10 nsec to be pulled up to a voltage of 3.3V. Accordingly, the cell plate line driving circuit of the present invention can perform the higher speed operation than the conventional cell plate line driving circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for driving a cell plate line of a semiconductor memory device having a plurality of memory cells, comprising:

a first driving means for driving the cell plate line with a first power supply voltage;

a second driving means for driving the cell plate line with a second power supply voltage higher than the first power supply voltage; and a driving control means for enabling said second driving means for a predetermined time in order to activate the cell plate line in response to a control signal from an external circuit and enabling said first driving means after the predetermined time in order to stabilize said second driving means enabled, wherein the control signal is employed to select one memory cell related to the cell plate line.

2. The apparatus as recited in claim 1, wherein said first driving means includes:

a latch means for latching an output signal of said driving control means, wherein said latch means contains inverters; and a PMOS transistor, coupled between a source of the first power supply voltage and the cell plate line, for applying the first power supply voltage to the cell plate line in response to the output signal of said driving control means inverted by an inverter of said latch means.

3. The apparatus as recited in claim 1, wherein said second driving means includes:

a PMOS transistor, coupled between a source of the second power supply voltage and the cell plate line, for applying the second power supply voltage to the cell plate line; and a circuit for determining a gate voltage level of said PMOS transistor in response to an output signal of said driving control means.

4. The apparatus as recited in claim 1, wherein said driving control means includes:

a pulse generator for generating a pulse having a pulse width of the predetermined time at a point of time when the control signal is activated, in order to enable said second driving means for the predetermined time in response to the activated control signal; and a passing gate for passing the control signal to said first driving means in response to the generated pulse.

5. The apparatus as recited in claim 4, wherein said pulse generator includes:

inverters for inverting and delaying the control signal, wherein the number of inverters is an odd number; and a NAND gate for NANDing the inverted and delayed control signal and the control signal.

6. The apparatus as recited in claim 1, further comprising a third driving means for driving the cell plate line with a ground voltage in order to inactivate the cell plate line in response to the control signal from the external circuit.

7. The apparatus as recited in claim 6, wherein said third driving means includes:

an inverter for inverting the control signal; and an NMOS transistor, coupled between a source of a ground voltage and the cell plate line, for applying the ground voltage to the cell plate line in response to the inverted signal.

* * * * *